United States Patent
Hughes et al.

(10) Patent No.: US 6,313,780 B1
(45) Date of Patent: Nov. 6, 2001

(54) ANALOGUE TO DIGITAL CONVERTER

(75) Inventors: John B. Hughes, Hove; William Redman-White, West Wellow, both of (GB); Mark Bracey, San Jose, CA (US)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/406,655

(22) Filed: Sep. 27, 1999

(30) Foreign Application Priority Data

Sep. 30, 1998 (GB) .................................... 9821091

(51) Int. Cl.$^7$ ....................................... H03M 1/14
(52) U.S. Cl. ................... 341/156; 341/161; 341/162; 341/165; 341/172; 341/158; 341/120
(58) Field of Search .................... 341/161, 155, 341/138, 156, 139, 163, 126, 118, 121, 128, 129, 172, 162; 340/347

(56) References Cited

U.S. PATENT DOCUMENTS

| | | |
|---|---|---|
| 4,611,196 * | 9/1986 | Fernandez . |
| 4,893,124 * | 1/1990 | Tsuji et al. . |
| 4,894,657 * | 1/1990 | Hwang et al. . |
| 4,903,026 | 2/1990 | Tiemann et al. ...................... 341/131 |
| 5,043,732 * | 8/1991 | Robertson et al. . |
| 5,465,093 | 11/1995 | Kusumoto et al. .................. 341/122 |
| 5,583,503 | 12/1996 | Kusakabe ............................ 341/161 |

OTHER PUBLICATIONS

"A Full Nyquist 15 MS/s 8–b Differential Switched–Current A/D Converter" by Mark Bracey et al, IEEE Journal of Solid State Circuits, vol. 31, No. 7, Jul. 1996.

"A 10 Bit Pipelined Switched–Current A/D Converter", by D. Macq et al, IEEE Journal of Solid State Circuits, vol. 29, No. 8, Aug. 1994.

"New Current–Mode Pipeline A/D Converter Architecture", by Mikael Gustavson et al, IEEE International Symposium on Circuits and Systems, Jun. 9–12, 1997.

\* cited by examiner

*Primary Examiner*—Michael Tokar
*Assistant Examiner*—Lam T. Mai

(57) ABSTRACT

A current mode pipelined analogue to digital converter (ADC) has a plurality of serially connected conversion stages. Each conversion stage has an input (40) for receiving a sampled and held current which is connected via a switch (S41) to a first current memory (M42) and via a switch (S40) to a second current memory (M41). The output of the second current memory (M41) is fed via a switch (S44) to one input of a summing junction (46). The output of the first current memory (M42) is fed via a switch (S42) to the input of a comparator (L44) whose output is clocked into a latch (L44) whose Q output is connected to an output (45) as the digital result of the conversion. The Q output of the latch (L44) is also connected to a digital to analogue converter (46) whose analogue output is fed to a second input of the summing junction 46 via a switch (S43) to form the analogue residue signal for application via output (47) to the next conversion stage in the pipeline. The stage has the advantage that the analogue signal is fed from stage to stage using only one current memory (M41) thus reducing transmission loss and that corruption of the analogue signal by comparator "kick back" is avoided by using a further current memory (M42) in parallel with the signal path current memory (M41).

18 Claims, 6 Drawing Sheets

ANALOGUE TO DIGITAL CONVERTER

Figure 1:
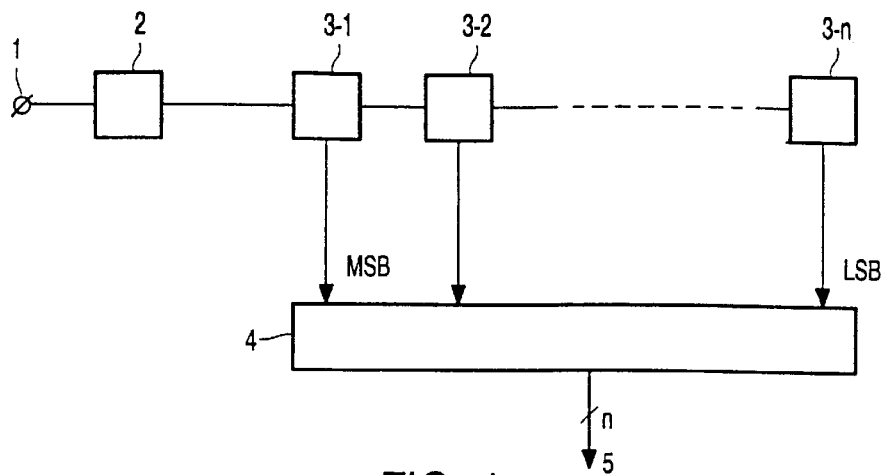

The invention relates to current mode pipelined analogue to digital (A/D) converters and to a single stage for use in such converters.

Such an A/D converter is disclosed in a paper entitled "A Full Nyquist 15 MS/s 8-b Differential Switched-Current A/D Converter" by Mark Bracey, William Redman-White, Judith Richardson, and John B. Hughes published in IEEE Journal of Solid State Circuits, Vol. 31, No. 7, July 1996. In the A/D converter disclosed each bit stage includes two current memory circuits in the signal path. This increases the transmission loss, noise, and power consumption.

A further A/D converter which also contains two current memory circuits in the signal path in each bit stage is disclosed in a paper entitled "A 10 Bit Pipelined Switched-Current A/D Converter" by D. Macq and P. G. A. Jespers published in IEEE Journal of Solid-State Circuits Vol. 29, No. 8, August 1994. This, of course, suffers the same disadvantages as that in the preceding paragraph.

A pipelined A/D converter is disclosed in a paper entitled "New Current-Mode Pipeline A/D Converter Architecture" by Mikael Gustavsson and Nianxiong Tan published in 1997 IEEE international Symposium on Circuits and Systems, Jun. 9–12 1977 in which each bit stage in the pipelined converter uses only a single current memory. In this arrangement a first generation switched current memory is used as the quantiser and the current memory of the next bit cell are time interleaved which makes it necessary to provide the output current in all clock phases.

It has been found that when a comparator circuit including a regenerative latching circuit is connected to the output of a current memory circuit it can cause a corruption of the current stored in the current memory. Thus if only a single current memory is used in a bit stage the current passed on to the next stage may be corrupted by the operation of the comparator. This is one factor which has caused designs to be proposed where two current memories per bit stage are used in the signal transmission path. As disclosed in the paper by Bracey et al the first current memory passes an uncorrupted current to the second current memory before the comparison takes place thus making any corruption of the current in the first current memory caused by the action of the comparator unimportant as the corrupted current is not further used after application to the comparator.

It is an object of the invention to enable the provision of a current mode pipelined A/D converter in which some or all of the problems involved with the prior art are reduced or eliminated.

The invention provides a current mode pipelined analogue to digital converter (ADC) comprising a plurality of serially connected conversion stages; in which each conversion stage comprises a current input for receiving a series of input current samples, a current output for producing a series of residual current samples, and a digital output for producing a digital signal representing the digital conversion performed by the stage, means for coupling the current input to the input of a first current memory circuit during a first portion of each sample conversion period, means for coupling the current input to the input of a second current memory circuit during a second portion of each sample conversion period, a current comparator having a first input coupled to the output of the first current memory circuit, a second input which receives a reference current, and an output coupled to the digital output and to the input of a digital to analogue converter (DAC), and current summing means having a first input coupled to the output of the second current memory circuit, a second input coupled to the output of the DAC, and an output coupled to the current output.

The use of two current memory stages in each conversion stage each of which sample the input current at different times and one of which passes on the sampled input current to the output of the conversion stage enables the transmission loss to be minimised without incurring the penalty of corruption of the current passed on to the next stage by comparator "kick back". Thus in the arrangement according to the invention the current memory which is connected to the comparator plays no part in determining the current passed to the next stage, apart from enabling the comparator decision which controls the DAC, and consequently will not corrupt that current. Consequently any corruption of the current stored caused by comparator "Kick Back" is unimportant because the sample stored in the memory cell driving the comparator is not in the signal path and is discarded after the decision has been made.

Each conversion stage may produce one bit of the digital output of the ADC. This enables a simple DAC to be used which merely takes the output of a single comparator as its digital input. It would, of course, be possible to convert more than one bit per conversion stage, but this would require more complex circuitry, for example a plurality of comparators, a plurality of outputs from the first current memory (which could be provided using current mirror circuits), and a plurality of switched matched current sources in the DAC.

The output of the first current memory circuit may be applied to the first input of the comparator during the second portion of the sample period. This enables a minimum delay before the result of the comparison is available (and hence the digital output of the stage).

Each sample period may be divided into four phases wherein during a first phase the input current sample is sampled and stored in the first current memory, during a second phase the input current sample is sampled and stored in the second current memory and the output of the first current memory is fed to the first input of the comparator, during a third phase the result of the comparison is fed to the digital output as the result of the present conversion stage and to the input of the DAC and during a fourth and subsequent phase the output of the DAC and the second current memory are fed to the respective inputs of the summing means, the output of the summing means being coupled to the current output to provide the residual current output of the conversion stage.

It will be appreciated by those skilled in the art that in these circumstances each conversion stage will take only three of the phases to convert the input sample current and pass the residual sample current to the next conversion stage. Consequently the timing shifts by one phase of the sample period from stage to stage. This is of little consequence in that the deskewing logic is already present to reconcile the pipeline timing and this additional timing shift can easily be taken care of in that logic. One consequence is that the total time delay along the pipeline for an individual input sample is reduced to 75% of that where as whole sample period is used for each conversion stage.

Alternatively each sample period may be divided into four phases; wherein during a first and a second phase the input current sample is sampled and stored in the first current memory circuit, the output of the second current memory circuit is fed to the first input of the current summing means, the output of the DAC is fed to the second input of the current summing means, and the output of the current summing means is coupled to the current output to provide the residual current output of the conversion stage; during the third phase the input current sample is sampled and stored in the second current memory circuit and the output of the first current memory circuit is fed to the first input of the comparator; and during a fourth phase the result of the comparison is fed to the digital output as the digital conversion by the present conversion stage and to the input of the DAC, the output of the DAC and the second current memory are fed to the respective inputs of the summing means, and the output of the summing means is coupled to the current output to provide the residual current output of the conversion stage.

In this case each conversion stage takes all of the sample period to produce the residual sample current for application to the next stage allowing longer for the first current memory circuit to settle, hence giving better settling accuracy.

The invention further provides a current mode pipelined analogue to digital converter (ADC) for converting differential input current samples comprising a plurality of serially connected conversion stages; in which each conversion stage comprises a differential current input for receiving a series of differential input current samples, a differential current output for producing a series of differential residual current samples, and a digital output for producing a digital signal representing the digital conversion performed by the stage, means for coupling the current input to the input of a first current memory circuit capable of storing a differential current sample during a first portion of each sample conversion period, means for coupling the current input to the input of a second current memory circuit capable of storing a differential current sample during a second portion of each sample conversion period, a current comparator having first and second inputs coupled to the output of the first current memory circuit, and an output coupled to the digital output and to the input of a digital to analogue converter (DAC) capable of producing a differential output current in response to its digital input, and current summing means having a first differential input coupled to the output of the second current memory circuit, a second differential input coupled to the output of the DAC, and a differential output coupled to the differential current output to provide the residual differential current output of the conversion stage.

By this means it is possible to convert an input differential current to a digital signal. This enables any analogue signal processing prior to conversion of the analogue signal to a digital signal to be carried out in a differential mode enabling the advantages of such processing of analogue signals to be obtained and avoiding any need to convert from differential to single ended signals in the analogue domain.

Each conversion stage may produce one bit of the digital output of the ADC. The output of the first current memory circuit may be applied to the inputs of the comparator during the second portion of the sample period.

Each sample period may be divided into four phases wherein during a first phase the input current sample is sampled and stored in the first current memory, during a second phase the input current sample is sampled and stored in the second current memory and the output of the first current memory is fed to the inputs of the comparator, and during a third phase the result of the comparison is fed to the digital output as the digital conversion by the present conversion stage and to the input of the DAC and the output of the DAC and the second current memory are fed to the respective inputs of the summing means,the output of the summing means being coupled to the current output to provide the residual current output of the conversion stage.

Alternatively each sample period may be divided into four phases; wherein during a first and a second phase the input current sample is sampled and stored in the first current memory circuit, the output of the second current memory circuit is fed to the first differential input of the current summing means, the output of the DAC is fed to the second differential input of the current summing means, and the differential output of the current summing means is coupled to the differential current output to provide the differential residual current output of the conversion stage; during the third phase the input current sample is sampled and stored in the second current memory circuit, during a third phase the output of the first current memory circuit is fed to the first input of the comparator; and during a fourth phase the result of the comparison is fed to the digital output as the digital conversion by the present conversion stage and to the input of the DAC, the differential outputs of the DAC and the second current memory are fed to the respective differential inputs of the summing means, the differential output of the summing means being coupled to the differential current output to provide the differential residual current output of the conversion stage.

The invention yet further provides a multiplexed current mode pipelined analogue to digital converter (ADC) comprising first and second pluralities of serially connected conversion stages; in which each conversion stage of the first plurality comprises a current input for receiving a series of input current samples, a current output for producing a series of residual current samples, and a digital output for producing a digital signal representing the digital conversion performed by the stage, means for coupling the current input to the input of a first current memory circuit during a third portion of each sample conversion period, means for coupling the current input to the input of a second current memory circuit during a fourth portion of each sample conversion period, a current comparator having a first input coupled to the output of the first current memory circuit, a second input which receives a reference current, and an output coupled to the digital output and to the input of a digital to analogue converter (DAC), and current summing means having a first input coupled to the output of the second current memory circuit, a second input coupled to the output of the DAC, and an output coupled to the current output; and in which each conversion stage of the second plurality comprises a current input for receiving a series of input current samples, a current output for producing a series of residual current samples, and a digital output for producing a digital signal representing the digital conversion performed by the stage, means for coupling the current input to the input of a first current memory circuit during a third portion of each sample conversion period, means for coupling the current input to the input of a second current memory circuit during a fourth portion of each sample conversion period, a current comparator having a first input coupled to the output of the first current memory circuit, a second input which receives a reference current, and an output coupled to the digital output and to the input of a digital to analogue converter (DAC), and current summing means having a first input coupled to the output of the second current memory circuit, a second input coupled to the output of the DAC, and an output coupled to the current output: wherein the first current memory, the comparator, and the DAC are common to the respective conversion stages of the first and second pluralities of conversion stages.

By multiplexing two pipeline converters an effective doubling of the speed of conversion can be obtained and by the measures according to the invention an economy of circuitry can be obtained. Thus the first current memory circuit, the comparator, and the DAC can be shared by the respective conversion stages in both pipelines. It is of course possible to increase the number of pipelines in multiples of two, each pair of pipelines sharing the first current memory, comparator, and DAC. Each increase in the number of pipelines will appropriately increase the possible conversion rate although this is only possible until the effective sample rate reaches the internal clock rate.

Each sample period may be divided into four phases: wherein in the conversion stage of the first plurality of conversion stages during a first phase the first current memory circuit samples and stores the input current sample, the output of the second current memory circuit is coupled to the summing means, and the output of the DAC is coupled to the summing means; during a second phase the second current memory circuit samples and stores the input current sample and the output of the first current memory circuit is fed to the comparator; during a third phase the output of the comparator is coupled to the digital output of the conversion stage; and during a fourth phase the result of the comparison is applied to the DAC as its digital input, the output of the DAC is fed to the summing means, and the output of the second current memory circuit is fed to the summing means: and wherein in the conversion stage of the second plurality of conversion stages during the first phase the output of the comparator is coupled to the digital output, during the second phase the result of the comparison is applied to the DAC as its digital input signal, the output of the DAC is fed to the summing means, and the output of the second current memory circuit is fed to the current summing means; during the third phase the first current memory circuit samples and stores the input current sample, the output of the DAC is fed to the current summing means, and the output of the second current memory circuit is fed to the current summing means; and during the fourth phase the second current memory circuit samples and stores the input current sample and the output of the first current memory is coupled to the comparator input.

The output of the comparator may be clocked into a first latch circuit at the beginning of the first and third phases, the output of the latch being connected to a common digital output of the respective conversion stages of the first and second pluralities.

The output of the first latch circuit may be clocked into a second latch circuit at the beginning of the second and fourth phases, the output of the second latch circuit providing the digital input for the DAC.

This ensures that the output of the DAC which is fed to the appropriate summing junction is dependent on the same input current sample as that stored in the relevant second current memory.

The invention still further relates to a multiplexed current mode pipelined analogue to digital converter (ADC) for converting differential input current samples comprising first and second pluralities of serially connected conversion stages: in which each conversion stage of the first plurality comprises a differential current input for receiving a series of differential input current samples, a differential current output for producing a series of differential residual current samples, and a digital output for producing a digital signal representing the digital conversion performed by the stage, means for coupling the current input to the input of a first current memory circuit capable of storing a differential current sample during a first portion of each sample conversion period, means for coupling the current input to the input of a second current memory circuit capable of storing a differential current sample during a second portion of each sample conversion period, a current comparator having first and second inputs coupled to the differential outputs of the first current memory circuit, and an output coupled to the digital output and to the input of a digital to analogue converter (DAC) capable of producing a differential output current in response to its digital input, and current summing means having a first differential input coupled to the output of the second current memory circuit, a second differential input coupled to the output of the DAC, and a differential output coupled to the differential current output; and in which each conversion stage of the second plurality comprises a differential current input for receiving a series of differential input current samples, a differential current output for producing a series of differential residual current samples, and a digital output for producing a digital signal representing the digital conversion performed by the stage, means for coupling the current input to the input of a first current memory circuit capable of storing a differential current sample during a third portion of each sample conversion period, means for coupling the current input to the input of a second current memory circuit capable of storing a differential current sample during a fourth portion of each sample conversion period, a current comparator having first and second inputs coupled to the differential outputs of the first current memory circuit, and an output coupled to the digital output and to the input of a DAC capable of producing a differential output current in response to its digital input, and current summing means having a first differential input coupled to the output of the second current memory circuit, a second differential input coupled to the output of the DAC, and a differential output coupled to the differential current output: wherein the first current memory, the comparator, and the DAC are common to the respective conversion stages of the first and second pluralities of conversion stages.

This enables the advantages of differential processing of the analogue signals to be obtained in a multiplexed pipelined converter in the same manner as discussed above with respect to a non-multiplexed converter.

Each sample period may be divided into four phases: wherein in the conversion stage of the first plurality of conversion stages during a first phase the first current memory circuit samples and stores the input current sample, the output of the second current memory circuit is coupled to the summing means, and the output of the DAC is coupled to the summing means; during a second phase the second current memory circuit samples and stores the input current sample and the output of the first current memory circuit is fed to the comparator; during a third phase the output of the comparator is coupled to the digital output of the conversion stage; and during a fourth phase the result of the comparison is applied to the DAC as its digital input, the output of the DAC is fed to the summing means, and the output of the second current memory circuit is fed to the summing means: and wherein in the conversion stage of the second plurality of conversion stages during the first phase the output of the comparator is coupled to the digital output, during the second phase the result of the comparison is applied to the DAC as its digital input signal, the output of the DAC is fed to the summing means, and the output of the second current memory circuit is fed to the current summing means; during the third phase the first current memory circuit samples and stores the input current sample, the output of the DAC is fed to the current summing means, and the output of the second current memory circuit is fed to the current summing means; and during the fourth phase the second current memory circuit samples and stores the input current sample and the output of the first current memory is coupled to the comparator input.

The output of the comparator may be clocked into a first latch circuit at the beginning of the first and third phases, the output of the latch being connected to a common digital output of the respective conversion stages of the first and second pluralities. The output of the first latch circuit may be clocked into a second latch circuit at the beginning of the second and fourth phases, the output of the second latch circuit providing the digital input for the DAC.

Figure 5:
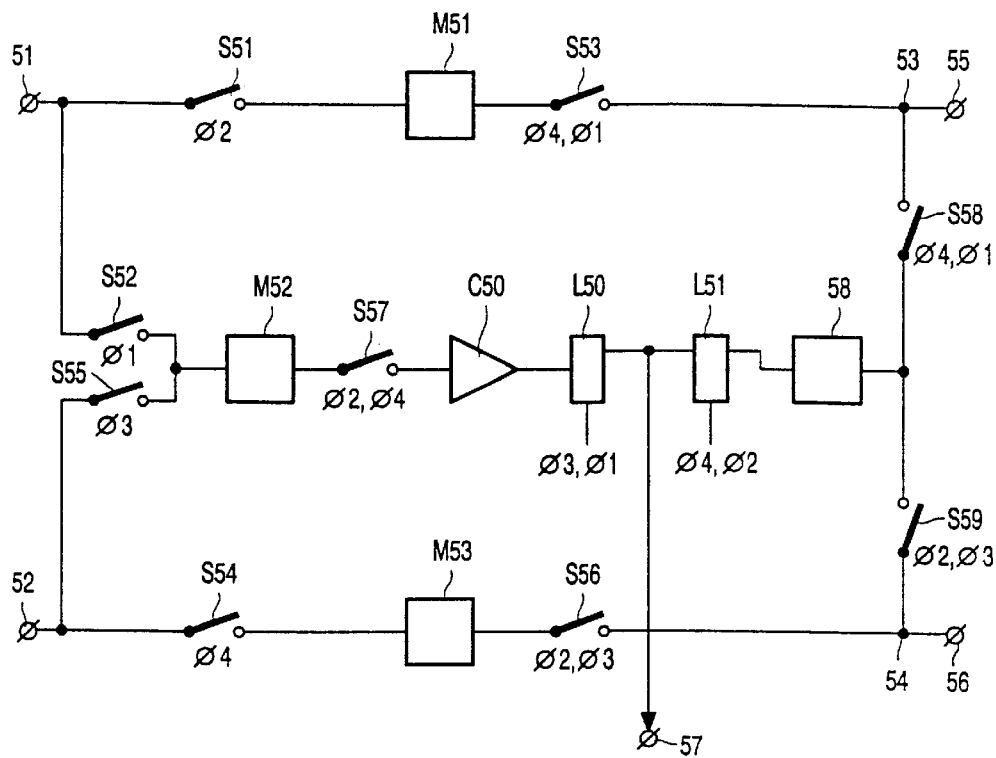
Figure 2:
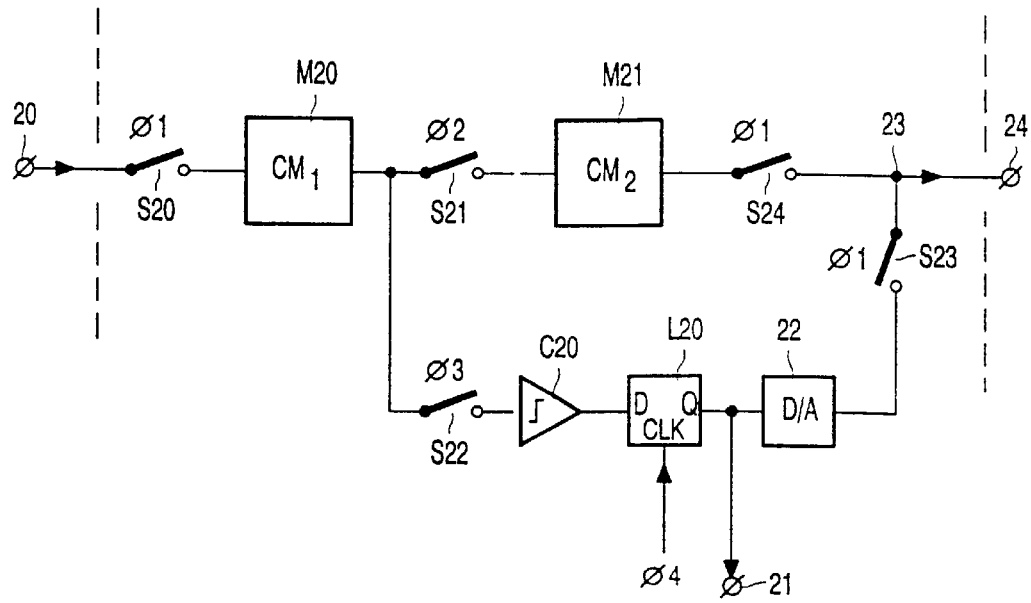
Figure 4:
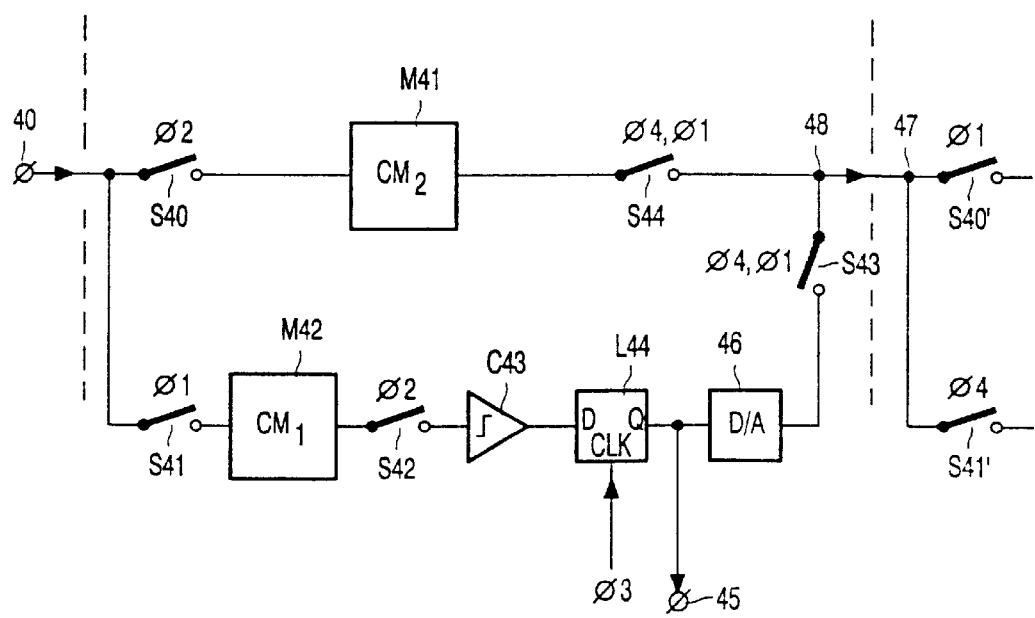
Figure 3:
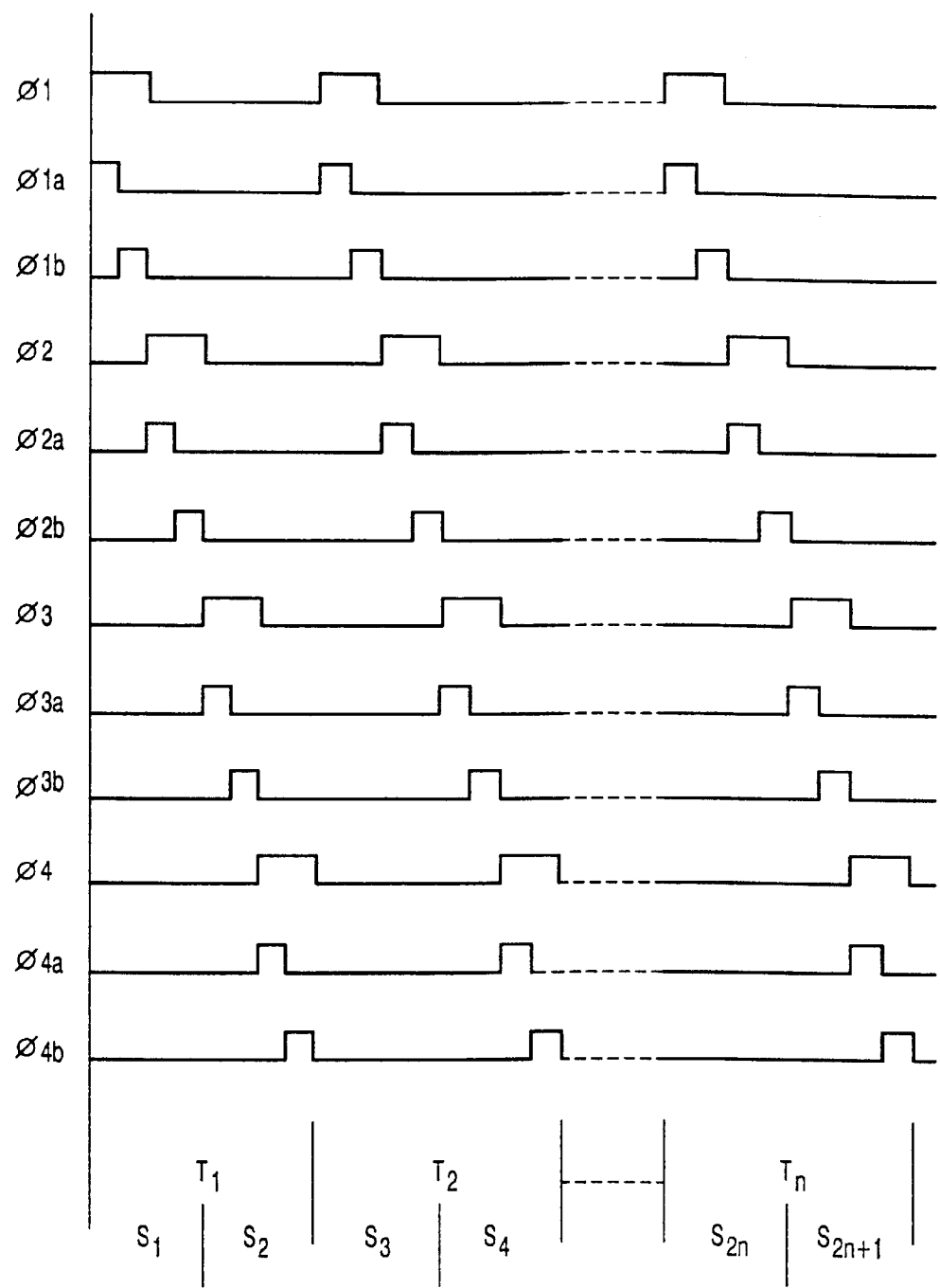
Figure 6:
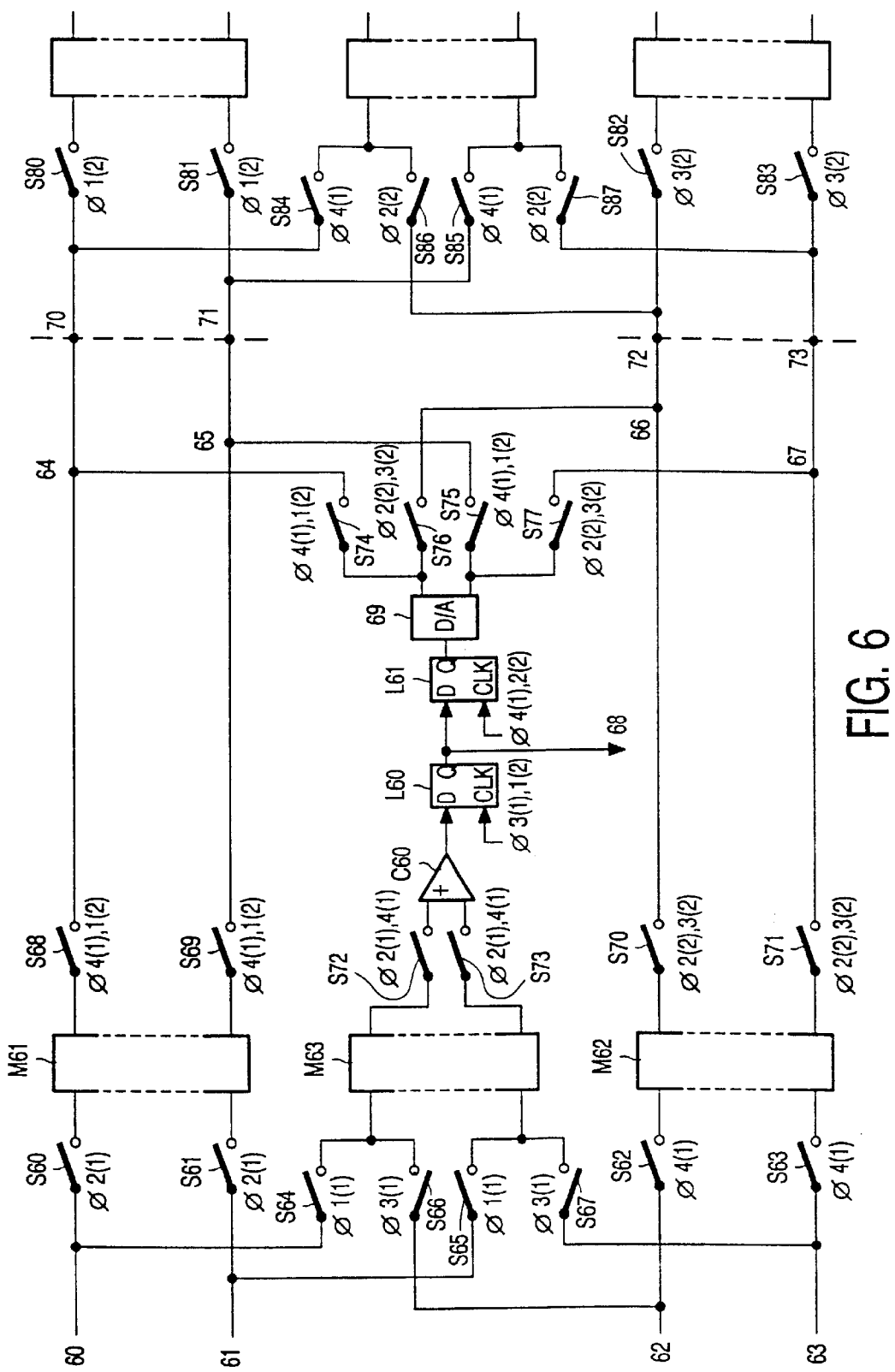
Figure 7A:
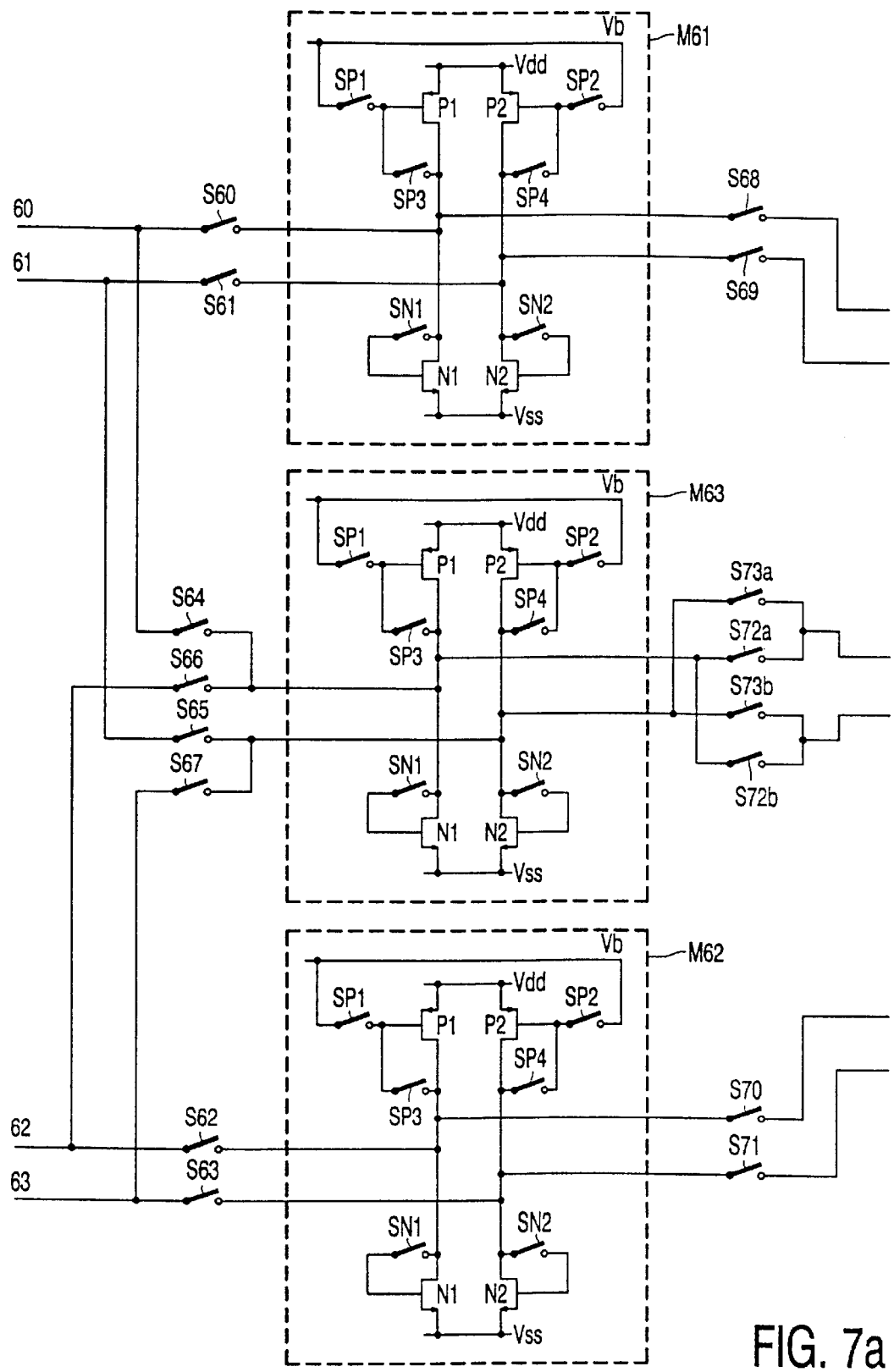
Figure 7B:
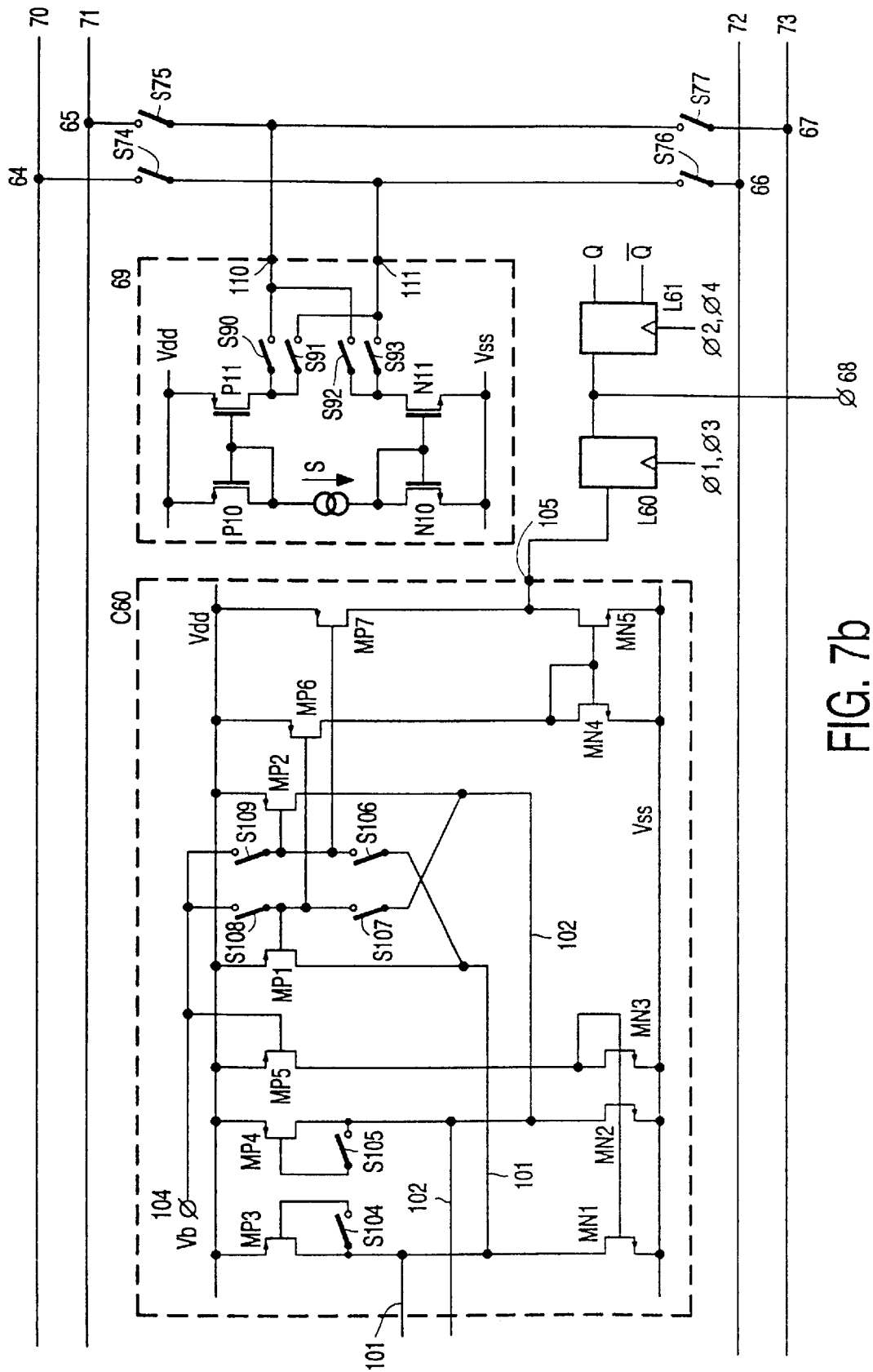

The above and other features and advantages of the invention will be apparent from the following description of embodiments of the invention,by a of example, with reference to the accompanying drawings, in which:, FIG. 1 shows in block schematic form a current mode pipelined digital to analogue converter in which the present invention may be embodied, FIG. 2 shows a prior art conversion stage for a pipelined ADC, FIG. 3 shows clock signals used to operate switches and clock latches in the embodiments of the invention FIG. 4 shows a first embodiment of a conversion stage for an ADC according to the invention FIG. 5 shows a second embodiment of a conversion stage for a multiplexed ADC according to the invention FIG. 6 shows a third embodiment of a conversion stage for a multiplexed differential ADC according to the invention, and FIGS. 7a and 7b shows the embodiment of FIG. 6 in which specific implementations of the circuit blocks are shown.

FIG. 1 shows in block schematic form a current mode pipelined analogue to digital converter in which the present invention may be embodied. The converter shown in FIG. 1 has an input 1 to which a signal to be converted is applied. The input 1 is connected to a voltage to current converter 2 if the input signal is in terms of a voltage signal. If the input signal is already in the form of a current then the voltage to current converter 2 will not be required. Additionally if input 1 receives a continuous signal then a sample and hold circuit is needed to hold the input signal constant for two phases of the clock signal. The sample and hold circuit may sample either an input voltage or input current as appropriate, depending on the form of the input signal and whether it is placed before or after any necessary voltage to current converter. The output of the voltage to current converter 2 is connected to a first input of a plurality of serially connected conversion stages 3-1 to 3-N, each of which is arranged to produce one bit of the digital output. The first conversion stage 3-1 produces the most significant bit while the last conversion stage 3-N produces the least significant bit of the digital output. The output of each of the conversion stages 3-1 to 3-N is fed to de-skewing logic 4 whose output produces the digital N-bit signal at the output 5. The function of the de-skewing logic 4 is to resolve the timing of the output from each of the individual bit stages so that the particular sample to be converted is arranged to produce the N-bit output. As will be clear to the person skilled in the art the output from a given input sample produced by conversion stage 3-N will be N sample periods later than the output of the most significant bit of that sample from the conversion stage 3-1 Thus while a pipelined analogue to digital converter will produce digital words at the sample rate there is a delay between applying a sample to the digital to analogue converter and the digital code emerging which is representative of the conversion of that particular sample. That is at the time the least significant bit emerges for sample 1 the most significant bit is being converted for sample N.

FIG. 2 shows a single ended form of the conversion stage disclosed in the paper by Bracey et al. As shown in FIG. 2 the conversion stage has an input 20 which is connected via a switch S20 to a current memory circuit M20. The output of the current memory circuit M20 is connected via a switch S21 to the input of a second current memory circuit M21 and via a switch S22 to an input of a comparator C20. The output of the comparator is fed to the data input of a latch L20 whose clock input is fed with a waveform Φ4. The Q output of the latch L20 is connected to an output 21 at which the digital conversion produced by the conversion stage is available. The Q output of the latch L20 is further connected to the input of a digital to analogue converter 22, whose output is connected via a switch S23 to a summing junction 23. The output of the second current memory M21 is connected via a switch S24 to the current summing junction or node 23. The current summing node 23 is connected to an output 24 of the conversion stage where the analogue residue signal is produced for application to the next conversion stage in the pipeline.

FIG. 3 shows waveforms Φ1, Φ2, Φ3 and Φ4 which are used to operate the switches and latch in the conversion stage and their relationship to the sample period $T_N$. Switches S20, S23 and S24 are closed when the waveform Φ1 is high. Switch S21 closes when waveform Φ2 is high. Switch S22 closes when waveform Φ3 is high. The latch L20 is clocked by the leading edge of waveform Φ4.

In operation an input current is applied to the input 20 and sensed and stored in the first current memory M20 during phase Φ1 of each sample period. During the phase Φ2 the first current memory is connected to the second current memory M21 via the switch S21 and the input current is resampled into the second current memory M21 thus providing a clean sample for passing on to the next bit stage. During phase Φ3 switch S22 closes and switch S21 opens and the input current stored in the first current memory M20 is applied to the input of the comparator C20 in which it is compared with a reference current and the comparator produces an output which is fed to the data input of the latch L20. The result of the comparison is clocked into the latch L20 by the leading edge of waveform Φ4 and during the phase Φ4 the digital output of the bit stage is available at output 21. The Q output of the latch L20 is also connected to the digital to analogue converter 22 and during the phase Φ1 of sample period $S_{N+1}$ the residue analogue signal is available at output 24 for sampling by the next conversion stage in the pipeline. A more detailed description of the operation of a conversion stage and the pipeline architecture of the analogue to digital convertor may be obtained from reading the paper by Bracey et al referred to in the introduction.

FIG. 4 shows in block schematic form a conversion stage for a pipelined analogue to digital converter according to the invention. As shown in FIG. 4 the conversion stage has an input 40 to which a sampled and held input analogue current is applied. The input 40 is connected to the input of a first current memory M42 via a switch S41 and to the input of a second current memory M41 via a switch S40. The output of the first current memory M42 is connected via a switch S42 to an input of a comparator C43. The output of the comparator is connected to the data input of a latch circuit L44 which is clocked by the leading edge of waveform Φ3. The output of the latch circuit L44 is fed to an output 45 at which the digital bit contributed by the conversion stage is made available during phase Φ3 and to the input of a digital to analogue converter 46. The output of the digital to analogue converter 46 is fed via a switch S43 to a summing node 48. The output of the second current memory M41 is also fed via a switch S44 to the summing node 48. The summing node 48 is fed to an output 47 of the conversion stage. The input of the next conversion stage has a first switch S40' and a second switch S41' connected to the output of the present bit stage. Switches S41 and S40' are closed when waveform $\Phi 1$ is high, switches S40 and S42 are closed when waveform $\Phi 2$ is high, switches S43 and S44 are closed when either waveform $\Phi 1$ or waveform $\Phi 4$ is high, and switch S41' is closed when waveform $\Phi 4$ is high The operation of the conversion stage is as follows:

During phase $\Phi 1$ the first current memory M42 samples and stores the input current. During phase $\Phi 2$ the second current memory M41 samples and stores the input current and the output of the first current memory M42 is fed to the comparator C43. The comparator C43 compares the current fed to its input with a reference current, which for a 1 bit per stage conversion will be zero, i.e. the comparator detects the polarity of the current, and its output adopts a state dependent on the results of the comparison. The comparator C43 which is formed as a regenerative comparator may corrupt the signal held in the first current memory M42 but this is of no consequence as the signal current which is to be passed to the next bit stage is held in the second current memory M41 and remains uncorrupted. On phase $\Phi 3$ the output of the comparator is clocked into the latch L44. On phase $\Phi 4$ of the present sample period and during phase $\Phi 1$ of the next sample period the output of the digital to analogue converter 46 is subtracted from the output of the second current memory M41 to provide the signal supplied to the next stage. As shown this next stage samples the output on phase $\Phi 4$ into its equivalent of the first current memory circuit M42 via the switch S41' and on phase $\Phi 1$ of the next sample period into its second current memory M41 via the switch S40'. It will be noted that the conversion stage according to the invention also uses a four phase clock but unlike the previous arrangement which uses identical timing on every stage the timing advances by one clock phase for each successive stage in the embodiment of FIG. 4. This is of little consequence because re-timing of the N-bit output is needed to circumvent the skewing produced by a pipeline and thus this timing advance is compensated for in the de-skewing logic. It does, however, have the advantage that the delay through the pipeline is reduced to three quarters of that of the arrangement shown in FIG. 2.

Because only one current memory per stage is used to propagate the signal from input to output compared with the two current memory circuits used in the previous arrangement, the transmission loss and physically generated noise of the current memories has half the effect of those in the previous architecture. It should be noted that the first current memory M42 is not in the signal path as far as propagation of the signal is concerned but merely serves to present the input current applied to the conversion stage to the comparator within the conversion stage. This gives the advantage that the allowable transmission loss and physically generated noise of the current memories may be twice that of those used in the previous architecture and this allows lower power design. Alternatively by using the same current memory parameters an increased precision of conversion may be obtained.

The conversion stage shown in FIG. 4 may have the timing modified such that switch S41 is closed when either of waveforms $\Phi 1$ and $\Phi 2$ are high, that is it samples the input during phases $\Phi 1$ and $\Phi 2$ of each sample period. In that case switches S40 and S42 are closed when waveform $\Phi 3$ is high. The latch L44 is clocked by waveform $\Phi 4$, and switches S43 and S44 are closed when any of waveforms $\Phi 4$, $\Phi 1$, and $\Phi 2$ are high. In the next stage switch S40' is closed when waveform $\Phi 2$ is high while switch S41' is closed when either of waveforms $\Phi 4$ and $\Phi 1$ are high. It will be apparent to the skilled person that each of the other switches in the next stage are closed one clock phase earlier in the same way as switches S40' and S41'. The advantage of this arrangement is that it gives the current memory M42 longer to settle and thus a better settling accuracy.

It will be apparent that each stage of the pipeline needs four major clock phases to complete a single bit period conversion. Thus an internal sample rate of four times the conversion sample rate is required. For example, if the required conversion rate is 15 mega-samples per second then a 60 MHz internal sample rate clock is required to achieve that rate.

FIG. 5 shows a conversion stage for a multiplexed pipeline and a digital converter where two interleaved converters utilise the same comparator, first current memory circuit, and DAC.

As shown in FIG. 5 the conversion stage has a first input 51 for receiving a first current input sample and a second input 52 for receiving a second current input sample. The first input 51 is connected via a switch S51 to the input of a current memory circuit M51 and via a switch S52 to the input of a further current memory circuit M52. The output of the current memory circuit M51 is fed via a switch S53 to a summing node 53. The second input 52 is fed via a switch S54 to the input of a current memory circuit M53 and via a switch S55 to the input of the current memory circuit M52. The output of the current memory circuit M53 is fed via a switch S56 to a summing node 54. The summing node 53 is connected to a first input 55 of the next conversion stage while the summing node 54 is fed to a second input 56 of the next conversion stage. The output of the current memory circuit M52 is fed via a switch S57 to an input of a comparator C50, The output of the comparator C50 is fed to the D input of a latch L50 whose Q output is fed to an output 57 which produces the digital output for the conversion stage and to the D input of a further latch L51 whose Q output is fed to the input of a digital to analogue converter 58. The output of the digital to analogue converter 58 is fed to the first summing node 53 via a switch S58 and to the second summing node 54 via a switch S59.

In operation the samples applied to input 51 and 52 are interleaved. That is input 51 receives sample $S_N$, $S_{N+2}$, $S_{N+4}$, etc. while input 52 receives sample $S_{N+1}$, $S_{N+3}$, $S_{N+5}$, etc. Switch S51 is closed when waveform $\Phi 2$ is high, switch S52 is closed when waveform $\Phi 1$ is high, switch S53 is closed when either of waveforms $\Phi 4$ or $\Phi 1$ is high, switch S54 is closed when waveform $\Phi 4$ is high, switch S55 is closed when waveform $\Phi 3$ is high, switch S56 is closed when either of waveforms $\Phi 2$ or $\Phi 3$ is high, switch S57 is closed when either of waveforms $\Phi 2$ or $\Phi 4$ is high, switch S58 is closed when either of waveforms $\Phi 4$ or $\Phi 1$ is high, and switch S59 is closed when either of waveforms $\Phi 2$ or $\Phi 3$ is high. The latch L50 is clocked by the leading edge of waveforms $\Phi 3$ and $\Phi 1$, while the latch L51 is clocked by the leading edge of waveforms $\Phi 4$ and $\Phi 2$. As can be seen from FIG. 5 the current memory M52, comparator C50, latches L50 and 51 and digital to analogue converter 58 are common to both the input streams. It will be apparent to the person skilled in the art that with the conversion stage as shown in FIG. 5 the additional latch L51 is needed to delay the application of the results of the comparison to the D to A converter 58 in order that the current produced by the D to A converter 58 does not change while the switches S58 or S59 are closed. Thus, what is obtained is in effect two parallel pipelined analogue to digital converters which use a common second current memory, comparator, latches, and digital to analogue converter.

To summaries the operation of the interleaved pipeline conversion stage samples $S_N$, $S_{N+2}$, $S_{N+4}$ etc. (that is the odd samples) are applied to the input of the upper pipeline during phases Φ1 and Φ2 of sample periods T1, T2, T3 etc. and the digital output of the conversion stage for the upper pipeline is available during phases Φ3 and Φ4 of sample periods T1, T2, T3 etc. The samples $S_{N+1}$, $S_{N+3}$, $S_{N+5}$, etc. (that is the even samples) are applied to the lower pipeline during phases Φ3 and Φ4 of sample periods T1, T2, T3 etc. and the digital output of the conversion stage for the lower pipeline is available during phases Φ1 and Φ2 of sample periods T2, T3, T4 etc. This timing applies, of course, to the present conversion stage, each succeeding conversion stage has the timing of each pipeline advanced by one phase of the sample period T.

FIG. 6 shows a conversion stage for use in a fully differential pipelined converter having two multiplexed streams of current samples for conversion.

The conversion stage has first inputs 60 and 61 for receiving a first set of current samples and a second inputs 62, and 63 for receiving a second set of input current samples. The inputs 60 and 61 are fed to inputs of a differential current memory M61 via two switches S60 and S61. Similarly the inputs 62 and 63 are fed to the inputs of a differential current memory M62 via two switches S62 and S63. The inputs 60 and 61 are further connected to the inputs of a differential current memory M63 via switches S64 and S65. Similarly the inputs 62 and 63 are further connected to the inputs of the current memory M63 via switches S66 and S67. The outputs of the current memory M61 are connected to respective summing junctions 64 and 65 via switches S68 and S69, while the outputs of current memory M62 are connected to respective summing junctions 66 and 67 via switches S70 and S71. The outputs of the current memory M63 are connected to respective inputs of a comparator C60 via switches S72 and S73. The output of the comparator C60 is connected to the data input of a latch circuit L60 whose Q output is connected to a digital output 68 to give the digital result of the conversion in this stage. The Q output of the latch L60 is further connected to the D input of a further latch L61 whose Q output is connected to the inputs of a digital to analogue converter S69 whose differential outputs are connected to the summing junction 64 via a switch S74, to the summing junction 65 via switch S75, to the summing junction 66 via switch S76, and to the summing junction 67 via switch S77. The summing junctions 64 and 65 are connected to inputs 70 and 71 of the next bit stage while the summing junction 66 and 67 are connected to inputs 72 and 73 of the next bit stage.

As shown in FIG. 6 the switches S60 and S61 are closed when waveform Φ2 is high, the switches S62 and S63 are closed when waveform by Φ4 is high, the switches S64 and S65 are closed when waveform Φ1 is high, the switches S66 and S67 are closed when waveform Φ3 is high, the switches S68 and S69 are closed when either of waveforms Φ4 or Φ1 is high, the switches S70 and S71 are closed when either of waveforms Φ2 or Φ3 is high, the switches S72 and S73 are closed when either of waveforms Φ4 or Φ2 is high, the switches S74 and S75 are closed when either of waveforms Φ4 or Φ1 is high, and the switches S76 and S77 are closed when either of waveforms Φ2 or Φ3 is high. The latch circuit L60 latches the output of the comparator circuit C60 on the leading edge of waveforms Φ3 and Φ1, while the latch L60 latches the Q output of latch L60 on the leading edge of waveforms Φ4 and Φ2.

As shown in FIG. 6 the next conversion stage has an input switching arrangement which is identical in form to that of the present conversion stage. It comprises switches S80 to S87 arranged in the same configuration as switches S60 to S67.

Each conversion stage works with a conversion period T which is divided into four phases Φ1, Φ2, Φ3 and Φ4 as shown in FIG. 3. This is the internal sample rate of the analogue to digital converter. By producing a multiplexed pipeline such that one (odd) set of samples is applied to inputs 60 and 61 while a second (even) set of samples is applied to inputs 62 and 63, the external to sampling rate of the digital to analogue converter can be doubled.

In the following description of the operation of the upper pipeline of the converter it is assumed that samples $S_1$, $S_3$, $S_5$ etc. applied to inputs 60 and 61 are applied to the current memory M63 during phase Φ1 and to current memory M61 during phase Φ2 of periods T1, T2, T3 etc. Thus during phase Φ1 of conversion period T1 the current memory M63 samples the input applied to inputs 60 and 61 and stores the sampled current. During phase Φ2 of period T1 the current memory M61 samples the input current applied to inputs 60 and 61 and stores those sampled currents. Also during phase Φ2 the current stored in current memory M63 is applied to the comparator C60 via switches S72 and S73. The result of the comparison is clocked into a latch L60 by the leading edge of waveform Φ3. It is then available at the Q output of latch L60 and hence at output 68 during phases Φ3 and Φ4 of conversion period T1. The Q output of latch L60 is also fed to the D input of the latch L61 which is clocked by the leading edge of waveform Φ4. Thus at the beginning of phase Φ4 the Q output of latch L61 is applied to the digital to analogue converter 69 which produces an analogue output which is dependent on the state of the Q output of latch L61. During phase Φ4 of conversion period T1 and phase Φ1 of conversion period T2 the output of the digital to analogue converter S69 is fed to the summing junctions 64 and 65 via the switches S74 and S75. Switches S68 and S69 are also closed at this time and hence the analogue residue output of this stage is applied to the inputs 70 and 71 of the next conversion stage. Thus on phase Φ4 of conversion period T1 the analogue residue signal from the present conversion stage is applied to the current memory equivalent to current memory M63 in the next conversion stage. On phase Φ1 of the next conversion period T2 the switches S80 and S81 are closed and the analogue residue current from the present stage is fed to the equivalent current memory to current memory M61 of the present stage in the next stage.

Thus for each odd numbered sample $S_1$, $S_3$, $S_5$, etc., the present conversion stage of the upper pipeline samples the input current during phases Φ1 and Φ2 and makes available the digital output during phases Φ3 and Φ4 of periods T1, T2, T3 etc. As with the single pipeline converter the timing advances by one phase for each successive conversion stage, i.e. in the next conversion stage the input is sampled during phases Φ4 of T1 and Φ1 of T2 while the digital output is produced during phases Φ2 and Φ3 of T2. As discussed earlier this is of little significance and this advance of timing is taken into account in the de-skewing logic 4.

The operation of the lower pipeline is similar to that of the upper pipeline and samples $S_2$, $S_4$, $S_6$ etc. are applied to inputs 62 and 63 of the lower pipeline of the converter on phase Φ3 of period T1, T2, T3 etc. and are fed via switches S66 and S67 to the inputs of current memory M63 which samples and stores the input current applied to inputs 62 and 63. On phase Φ4 switches S62 and S63 are closed and the inputs of current memory M62 samples and stores the input current applied to inputs 62 and 63. On phase Φ4 of period T1 switches S72 and S73 close and the analogue current stored in current memory M63 is fed to the comparator C60. On phase Φ1 of the next period T2 the result of the comparison is latched into latch L60 by waveform Φ1. Thus the result of the conversion of the input sample connected during phases Φ3 and Φ4 of period T1 to the inputs 62 and 63 of this stage is available at output 68 during periods Φ1 and Φ2 of the next conversion period T2. The Q output of latch L60 is then clocked into latch L61 by waveform Φ2 and the Q output of latch L61 will control the digital to analogue converter 69. Switches S76 and S77 are closed during phases Φ2 and Φ3 as are switches S70 and S71. Consequently, the current stored in current memory M62 is summed with the current produced by the digital to analogue converter 69 to form the residue current of the present conversion stage and fed to the inputs 72 and 73 of the next conversion stage. During phase Φ2 of the next period T2 switches S86 and S87 are closed and the current memory equivalent to current memory M63 in the next stage samples and stores the residue current applied to inputs 72 and 73. Similarly during phase Φ3 switches S82 and S83 are closed and the current memory of the next stage equivalent to current memory M62 of the present stage samples and stores the input current.

It can be seen that for each even sample $S_2$, $S_4$, $S_6$ etc. the present conversion stage of the lower pipeline samples the input current during phases Φ3 and Φ4 of periods T1, T2, T3 etc. and makes available the digital output during phases Φ1 and Φ2 of periods T2, T3, T4 etc.

It will be apparent to the person skilled in the art that this arrangement enables conversion at twice the sample rate of a single non-multiplexed pipeline converter. It will also be apparent that this arrangement enables an economy of components since the comparator current memory, the comparator, and the digital to analogue converter can be used for both pipelines.

FIGS. 7a and b show in greater detail the arrangement of FIG. 6.

In FIG. 7 specific embodiments of the current memories, the comparator and the A to D converter are shown. These are of course only examples of current memories, comparators and D to A converters and may be substituted by other circuitry capable of performing these functions. In FIG. 7 corresponding reference signs have been used for the components which are shown in FIG. 6.

As shown in FIG. 7a each current memory comprises first and second p-channel field effect transistors P1 and P2 and first and second n-channel field effect transistors N1 and N2. Transistors P1 and N1 are connected in series between the supply rails $V_{dd}$ and $V_{ss}$, similarly transistors P2 and N2 are connected in series between the supply rails $V_{dd}$ and $V_{ss}$. A switch SP1 is connected between a bias rail $V_b$ and the gate electrode of transistor P1, while a switch SP2 is connected between the bias rail $V_b$ and the gate electrode of transistor P2. A further switch SP3 is connected between the gate and drain electrodes of transistor P1 while a further switch SP4 is connected between the gate and drain electrodes of transistor P2. A switch SN1 is connected between the gate and drain electrodes of transistor N1 while a switch SN2 is connected between the gate and drain electrodes of transistor N2. The switch S60 is connected between the input 60 and the junction of the drain electrodes of transistors P1 and N1, while the switch S61 is connected between the input 61 and the junction of the drain electrodes of transistors N2 and P2. The junction of transistors P1 and N1 is further connected to one side of the switch S68, while the junction of the drain electrodes of transistors N2 and P2 is connected to one side of the switch S69. The current memories M62 and M63 are of the same construction as the current memory M61. The phases Φ1, Φ2, Φ3 and Φ4 are further sub-divided into a) and b) sub-phases as shown in FIG. 3 and in the first or a) sub-phase of phase Φ2 switches SP1, SP2, SN1 and SN2 in the current memory M61 are closed. Consequently transistors P1 and P2 produce constant bias currents J which are defined by the bias voltage $V_b$. As a result transistors N1 and N2 which are diode connected pass a current equal to the bias current plus the input current applied to inputs 60 and 61 respectively. At the end of the a) sub phase, switches SN1, SN2, SP1 and SP2 are opened and switches SP3 and SP4 close during the b) sub phase. As a result the current sensed by transistors N1 and N2 is maintained when switches SN1 and SN2 open by the charge stored on the gate-source capacitance of these transistors. Similarly, the current passed by transistors P1 and P2 is initially maintained when the switches SP1 and SP2 are opened. When switches SP3 and SP4 close, transistor P1 senses the difference between the currents produced by transistor N1 and the input current at input 60 and transistor P2 senses the difference between the currents produced by transistor N2 and the input current at input 61. At the end of the b) sub-phase of phase Φ2 switches SP3 and SP4 open and the current is maintained in the current memory M61 by the charges on the gate-source capacitances of the transistors. At this time, of course, also the switches S60 and S61 open. During phase Φ4 and phase Φ1 of the next sample period, switches S68 and S69 are closed and the current stored by the current memory M61 is passed to the summing junctions 64 and 65. The current memory M62 is formed in the same manner as the current memory M61. Its switches SP1, SP2, SN1 and SN2 close during the a) sub-phase of phase Φ4 while its switches SP3 and SP4 close during the b) sub-phase of phase Φ4. The output switches S70 and S71 close during the phases Φ2 and Φ3 of the next period and connect the output of memory M62 to the summing junctions 66 and 67.

The current memory M63 is again of similar form to the current memory M61. However, in the case of current memory M63 the switches SP1, SP2, SN1 and SN2 close during the a) sub-phases of phases Φ1 and Φ3. Similarly the switches SP3 and SP4 close during the b) sub-phases of phases Φ1 and Φ3. Thus the current memory M63 will sense and store the current fed to it from input 60 and 61 during phase Φ1 and the current fed to it from inputs 62 and 63 during phase Φ3. During the sub-phase a) of phases Φ2 and Φ4 the switches S72a and S73a connect the output of the current memory M63 to the inputs of the comparator C60. During the sub-phase b) of the phases Φ2 and Φ4 the switches S72b and S73b connect the outputs of the current memory M63 to the inputs of the comparator C60 in the opposite sense. The current memories M61, M62, and M63 are as described in European Patent Application No. 0,608,936 (PHB33830) and reference may be made to that application in order to obtain a more complete description of its construction and operation.

The comparator C60 shown in FIG. 7b is of the same form and construction as that described in European Patent Application No. 0,744,032 (PHB33958).

The comparator C60 has a first input which is connected to the junction of switches S72a and S73a and which is fed via a line 101 to the drain electrode of a transistor MP3 and via a switch S104 to the gate electrode of transistor MP3. The line 101 is further connected to the drain electrode of a transistor MP1 and to the drain electrode of a transistor MN1. A second input is connected to the junction of switches S72b and S73b and is fed via a line 102 to the drain electrode of a transistor MP4 and via a switch S105 to its gate electrode. The line 102 is further connected to the drain electrode of a transistor MP2 and to the drain electrode of a transistor MP2. The gate electrode of transistor MP2 is connected via a switch S106 to the drain electrode of transistor MP1, while the gate electrode of transistor MP1 is connected via a switch S107 to the drain electrode of transistor MP2. The source electrodes of transistors MP1 to MP4 are connected to a supply rail $V_{dd}$ while the source electrodes of transistors MN1 and MN2 are connected to a supply rail $V_{ss}$. An input terminal 104 is connected to the gate electrode of a transistor MP5 and via a switch S108 to the gate electrode of transistor MP1 and a switch S109 to the gate electrode of the transistor MP2.

The drain electrode of the transistor MP5 is connected to the drain and gate electrodes of a transistor MN3. The gate electrode of transistor MN3 is connected to the gate electrodes of transistors MN1 and MN2. The source electrode of transistor MN3 is connected to the supply rail $V_{ss}$ while the source electrode of transistor MP5 is connected to the supply rail $V_{dd}$.

The gate electrode of transistor MP1 is connected to the gate electrode of a transistor MP6 while the gate electrode of transistor MP2 is connected to the gate electrode of a transistor MP7. The drain electrode of transistor MP6, is connected to the drain and gate electrodes of a transistor MN4, while the drain electrode of the transistor MP7 is connected to the drain electrode of a transistor MN5. The gate electrodes of transistors MN4 and MN5 are connected together.

The junction of the drain electrodes of transistors MP7 and MN5 are connected to an output terminal 105. The source electrodes of transistors MP6 and MP7 are connected to the supply rail $V_{dd}$ while the source electrodes of transistors MN4 and MN5 are connected to the supply rail $V_{ss}$.

The switches in the comparator are closed during the following phases and sub-phases. S72a, S73a, S104 and S105 are closed during the a) sub-phase of phases Φ2 and Φ4, S72b and S73b are closed during the b) sub phase of phases Φ2 and Φ4, S106 and S107 are closed during the b sub phases of phase Φ2 and Φ4 and the a) sub phases of phases Φ1 and Φ3, S108 and S109 are closed during the b) sub phase of phases Φ1 and Φ3 and during the a) sub phases of phases Φ2 and Φ4.

The comparator C60 comprises a cross coupled transistor pair MP1 and MP2 which form a latch biased by means of two current sources MN1 and MN2. The current sources produce a current of value 2J each, where J has the same value as the bias currents in the memory cells M61 to M63. Resetting the latch could be achieved by means of a switch shorting the cross coupled transistor pair MP1 and MP2 during the first part of phases Φ2 and Φ4 denoted Φ2a and Φ4a. However in this embodiment a bias reference transistor MP5 is used to set the current in transistors MP1 and MP2 to be equal to J which is the equivalent of the current density in the associated memory cells. Hence the input voltage defined by the comparator while it is sampling the outputs from S21 memory cells during phase Φ2a and Φ2b and Φ4a and Φ4b is identical to the nominal settling voltage of the fine current store itself, thereby minimising errors in current transfer. The difference current between that in MN1/MN2 and MP1/MP2, including any offset from the ideal 2:1 ratio, is carried by two sample current store transistors MP3 and MP4. This value together with the input signal is sensed during the period Φ2a for the upper pipeline and Φ4a for the lower pipeline. During the second part of phase Φ2 denoted Φ2b and phase Φ4 denoted Φ4b the input current store switches are opened, that is switches S104 and S105. Consequently it stores the differential input signal in one sense Idm, its common mode component Icm, and any offset currents. During Φ2b and Φ4b the latch transistors MP1 and MP2 are cross coupled by switches S106 and S107. The input signal switches S72b and S73b are closed so that the input currents are applied in the opposite sense, that is applying a differential input current with a reversed sign— Idm together with the common mode current Icm. The current stores MP3 and MP4 are now acting as current sources and a difference current of plus 2 Idm is applied to the latch. The common mode and offset are thus absorbed in the current sources MP3 and MP4. The latch now moves to its decision at a rate governed by the $C/g_m$ time constants. The output is available from the end of phase Φ2b until the end of phase Φ3a for the upper pipeline comparison and from the end of phase Φ4b until the end of phase Φ1a of the next conversion period for the lower pipeline comparison.

For correct operation of the comparator the output level translator comprising transistors MN4 and MN5 to-gether with transistors MP6 and MP7 needs to be constructed so that during the reset period both transistors MP6 and MP7 are in the saturated operating region until the latch is substantially set, i.e. capacitances are balanced throughout the switching regime. One way in which this can be achieved is by making the channel width to length ratio of transistor MN5 greater than that of transistor MN4. Consequently during reset the output of the comparator is always low.

The output of the comparator C60 is fed to the D input of a latch circuit L60 which is clocked by waveforms Φ1 and Φ3. The Q output of the latch L60 is connected to output 68 which gives the digital value from that conversion stage. This is available during phases Φ1 and Φ3 of each of the conversion periods. Thus during phase Φ3 of a conversion period the digital conversion of the input signal applied to inputs 60 and 61 is available, while during phase Φ1 of the next conversion period the digital conversion of the input signal applied to inputs 62 and 63 becomes available. The Q output of latch L60 is also fed to the D input of the latch L61 which is clocked by the leading edge of waveforms Φ2 and Φ4.

The Q and $\overline{Q}$ outputs control the output switches of the digital to analogue converter 69 and the state of these outputs will define the polarity of the current fed via the switches S74 to S77 to the summing junctions 64 to 67. Switches S74 and S75 are closed during phase Φ4 of the present conversion period and Φ1 of the next conversion period. Thus the state of the latch L61 as clocked by phase Φ4 will determine the polarity of the analogue current produced by the digital to analogue converter 69 and fed to the summing junctions 64 and 65. These outputs will remain constant until the phase Φ2 of the next conversion period when the new data will be clocked into the latch L61. Thus a constant current will be fed to summing junctions 64 and 65 for the duration of phase Φ4 of the present conversion period and Φ1 of the next conversion period whose polarity is dependent on the result of the comparison in comparator C60 during the phase Φ2 of the present conversion period.

The digital to analogue converter 69 comprises a p-channel field effect transistor P10 whose source electrode is connected to a supply rail Vdd and whose gate and drain electrodes are connected via a current source S to the gate and drain electrodes of an n-channel field effect transistor N10 whose source electrode is connected to a supply rail $V_{ss}$. A further p-channel field effect transistor P11 has its source electrode connected to the supply rail Vdd, its gate electrode connected to the gate electrode of transistor P10, and its drain electrode connected to the junction of one side of two switches S90 and S91. A further n-channel field effect transistor N11 has its source electrode connected to the supply rail $V_{ss}$, its gate electrode connected to the gate electrode of transistor N10, and its drain electrode connected to the junction of one side of two switches S92 and S93. The junction of the other side of switches S90 and S92 is connected to a first output 110 of the DAC while the junction of the other side of switches S91 and S93 is connected to a second output 111 of the DAC. The output 110 of the DAC is connected to the junction of switches S75 and S77 while the output 111 of the DAC is connected to the junction of switches S74 and S76. The switches S90 and S93 are closed when the Q output of latch L61 is high while the switches S91 and S92 are closed when the $\overline{Q}$ output of latch L61 is high.

Thus the D/A converter 69 will produce a differential current during phase Φ4 of the present conversion period and phase Φ1 of the next conversion period whose polarity is dependent on the comparator output derived from the input currents to input 60 and 61 during phases Φ1 and Φ2 of the present conversion period. This is summed with the input currents to inputs 60 and 61 which have been stored in the current memory M61 and which are also made available at that time.

In a similar manner to D/A converter 69 will produce a differential current during phases Φ2 and Φ3 of the next conversion period whose polarity is dependent on the comparator output derived from the input currents to input 62 and 63 during phases Φ3 and Φ4 of the present conversion period. The switches S76 and S77 are closed during phase Φ2 and Φ3 enabling the outputs of the D/A converter 69 to be passed to the summing junctions 72 and 73 where they are summed with the input currents to inputs 62 and 63 which have been stored in current memory M62 and which are also made available at that time.

Many modifications which will be apparent to the skilled person may be made to the embodiments shown. For example many forms of current memory circuits may be used depending on the performance required. The embodiment shown in FIG. 5 uses current memory circuits of the form shown in EP-A-0608 936 and generally known as S2I current memories but many other current memory circuits could be used. There will include enhanced S2I current memory circuits as disclosed in EP-A-0789920 (PHB 34007), EP-A-0789919 (PHB 34009), and EP-A-0789918 (PHB 34010) and also the S3I current memory circuit disclosed in EP-A-0848852 (PHB34088). In addition simple first generation current memories as disclosed in EP-A-0308 807 (PHB 33386) or second generation current memories also known as current copies could be used. In addition other current memory circuits are known which use regulated cascode circuits and also class A-B current memories. Any such current memory circuits could be used in an analogue to digital converter according to the present invention also the particular form of the current comparator and DAC may be chosen from many alternatives depending on the performance requirements of the analogue to digital converter.

From reading the present disclosure, other modifications will be apparent to persons skilled in the art. Such modifications may involve other features which are already known in the design and use of analogue to digital converters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A current mode pipelined analogue to digital converter (ADC) comprising a plurality of serially connected conversion stages; in which each conversion stage comprises a current input for receiving a series of input current samples, a current output for producing a series of residual current samples, and a digital output for producing a digital signal representing the digital conversion performed by the stage, means for coupling the current input to the input of a first current memory circuit during a first portion of each sample conversion period, means for coupling the current input to the input of a second current memory circuit during a second portion of each sample conversion period, a current comparator having a first input coupled to the output of the first current memory circuit, a second input which receives a reference current, and an output coupled to the digital output and to the input of a digital to analogue converter (DAC), and current summing means having a first input coupled to the output of the second current memory circuit, a second input coupled to the output of the DAC, and an output coupled to the current output.

2. An ADC as claimed in claim 1 in which each conversion stage produces one bit of the digital output of the ADC.

3. An ADC as claimed in claim 2 in which the output of the first current memory circuit is applied to the first input of the comparator during the second portion of the sample period.

4. An ADC as claimed in claim 1 in which each sample period is divided into four phases wherein during a first phase the input current sample is sampled and stored in the first current memory, during a second phase the input current sample is sampled and stored in the second current memory and the output of the first current memory is fed to the first input of the comparator, during a third phase the result of the comparison is fed to the digital output as the digital conversion by the present conversion stage and to the input of the DAC, and during a fourth and subsequent phase the output of the DAC and the second current memory are fed to the respective inputs of the summing means, the output of the summing means being coupled to the current output to provide the residual current output of the conversion stage.

5. An ADC as claimed in any of claim 3 in which each sample period is divided into four phases; wherein during a first and a second phase the input current sample is sampled and stored in the first current memory circuit, the output of the second current memory circuit is fed to the first input of the current summing means, the output of the DAC is fed to the second input of the current summing means, and the output of the current summing means is coupled to the current output to provide the residual current output of the conversion stage; during the third phase the input current sample is sampled and stored in the second current memory circuit and the output of the first current memory circuit is fed to the first input of the comparator; and during a fourth phase the result of the comparison is fed to the digital output as the digital conversion by the present conversion stage and to the input of the DAC, the output of the DAC and the second current memory are fed to the respective inputs of the summing means, and the output of the summing means is coupled to the current output to provide the residual current output of the conversion stage.

6. A current mode pipelined analogue to digital converter (ADC) for converting differential input current samples comprising a plurality of serially connected conversion stages; in which each conversion stage comprises a differential current input for receiving a series of differential input current samples, a differential current output for producing a series of differential residual current samples, and a digital output for producing a digital signal representing the digital conversion performed by the stage, means for coupling the current input to the input of a first current memory circuit capable of storing a differential current sample during a first portion of each sample conversion period, means for coupling the current input to the input of a second current memory circuit capable of storing a differential current sample during a second portion of each sample conversion period, a current comparator having first and second inputs coupled to the output of the first current memory circuit, and an output coupled to the digital output and to the input of a digital to analogue converter (DAC) capable of producing a differential output current in response to its digital input, and current summing means having a first differential input coupled to the output of the second current memory circuit, a second differential input coupled to the output of the DAC, and a differential output coupled to the differential current output to provide the residual differential current output of the conversion stage.

7. An ADC as claimed in claim 6 in which each conversion stage produces one bit of the digital output of the ADC.

8. An ADC as claimed in claim 6 in which the output of the first current memory circuit is applied to the inputs of the comparator during the second portion of the sample period.

9. An ADC as claimed in any of claim 8 in which each sample period is divided into four phases wherein during a first phase the input current sample is sampled and stored in the first current memory, during a second phase the input current sample is sampled and stored in the second current memory and the output of the first current memory is fed to the inputs of the comparator, and during a third phase the result of the comparison is fed to the digital output as the digital conversion by the present conversion stage and to the input of the DAC and the output of the DAC and the second current memory are fed to the respective inputs of the summing means, the output of the summing means being coupled to the current output to provide the residual current output of the conversion stage.

10. An ADC as claimed in any of claim 8 in which each sample period is divided into four phases; wherein during a first and a second phase the input current sample is sampled and stored in the first current memory circuit, the output of the second current memory circuit is fed to the first differential input of the current summing means, the output of the DAC is fed to the second differential input of the current summing means, and the differential output of the current summing means is coupled to the differential current output to provide the differential residual current output of the conversion stage; during the third phase the input current sample is sampled and stored in the second current memory circuit, during a third phase the output of the first current memory circuit is fed to the first input of the comparator; and during a fourth phase the result of the comparison is fed to the digital output as the digital conversion by the present conversion stage and to the input of the DAC, the differential outputs of the DAC and the second current memory are fed to the respective differential inputs of the summing means, the differential output of the summing means being coupled to the differential current output to provide the differential residual current output of the conversion stage.

11. A multiplexed current mode pipelined analogue to digital converter (ADC) comprising first and second pluralities of serially connected conversion stages; in which each conversion stage of the first plurality comprises a current input for receiving a series of input current samples, a current output for producing a series of residual current samples, and a digital output for producing a digital signal representing the digital conversion performed by the stage, means for coupling the current input to the input of a first current memory circuit during a first portion of each sample conversion period, means for coupling the current input to the input of a second current memory circuit during a second portion of each sample conversion period, a current comparator having a first input coupled to the output of the first current memory circuit, a second input which receives a reference current, and an output coupled to the digital output and to the input of a digital to analogue converter (DAC), and current summing means having a first input coupled to the output of the second current memory circuit, a second input coupled to the output of the DAC, and an output coupled to the current output; and in which each conversion stage of the second plurality comprises a current input for receiving a series of input current samples, a current output for producing a series of residual current samples, and a digital output for producing a digital signal representing the digital conversion performed by the stage, means for coupling the current input to the input of a first current memory circuit during a third portion of each sample conversion period, means for coupling the current input to the input of a second current memory circuit during a fourth portion of each sample conversion period, a current comparator having a first input coupled to the output of the first current memory circuit, a second input which receives a reference current, and an output coupled to the digital output and to the input of a digital to analogue converter (DAC), and current summing means having a first input coupled to the output of the second current memory circuit, a second input coupled to the output of the DAC, and an output coupled to the current output: wherein the first current memory, the comparator, and the DAC are common to the respective conversion stages of the first and second pluralities of conversion stages.

12. An ADC as claimed in claim 11 in which each sample period is divided into four phases: wherein in the conversion stage of the first plurality of conversion stages during a first phase the first current memory circuit samples and stores the input current sample, the output of the second current memory circuit is coupled to the summing means, and the output of the DAC is coupled to the summing means; during a second phase the second current memory circuit samples and stores the input current sample and the output of the first current memory circuit is fed to the comparator; during a third phase the output of the comparator is coupled to the digital output of the conversion stage; and during a fourth phase the result of the comparison is applied to the DAC as its digital input, the output of the DAC is fed to the summing means, and the output of the second current memory circuit is fed to the summing means: and wherein in the conversion stage of the second plurality of conversion stages during the first phase the output of the comparator is coupled to the digital output, during the second phase the result of the comparison is applied to the DAC as its digital input signal, the output of the DAC is fed to the summing means, and the output of the second current memory circuit is fed to the current summing means; during the third phase the first current memory circuit samples and stores the input current sample, the output of the DAC is fed to the current summing means, and the output of the second current memory circuit is fed to the current summing means; and during the fourth phase the second current memory circuit samples and stores the input current sample and the output of the first current memory is coupled to the comparator input.

13. An ADC as claimed in claim 12 in which the output of the comparator is clocked into a first latch circuit at the beginning of the first and third phases, the output of the latch being connected to a common digital output of the respective conversion stages of the first and second pluralities.

14. An ADC as claimed in claim 13 in which the output of the first latch circuit is clocked into a second latch circuit at the beginning of the second and fourth phases, the output of the second latch circuit providing the digital input for the DAC.

15. A multiplexed current mode pipelined analogue to digital converter (ADC) for converting differential input current samples comprising first and second pluralities of serially connected conversion stages: in which each conversion stage of the first plurality comprises a differential current input for receiving a series of differential input current samples, a differential current output for producing a series of differential residual current samples, and a digital output for producing a digital signal representing the digital conversion performed by the stage, means for coupling the current input to the input of a first current memory circuit capable of storing a differential current sample during a third portion of each sample conversion period, means for coupling the current input to the input of a second current memory circuit capable of storing a differential current sample during a fourth portion of each sample conversion period, a current comparator having first and second inputs coupled to the differential outputs of the first current memory circuit, and an output coupled to the digital output and to the input of a digital to analogue converter (DAC) capable of producing a differential output current in response to its digital input, and current summing means having a first differential input coupled to the output of the second current memory circuit, a second differential input coupled to the output of the DAC, and a differential output coupled to the differential current output; and in which each conversion stage of the second plurality comprises a differential current input for receiving a series of differential input current samples, a differential current output for producing a series of differential residual current samples, and a digital output for producing a digital signal representing the digital conversion performed by the stage, means for coupling the current input to the input of a first current memory circuit capable of storing a differential current sample during a third portion of each sample conversion period, means for coupling the current input to the input of a second current memory circuit capable of storing a differential current sample during a fourth portion of each sample conversion period, a current comparator having first and second inputs coupled to the differential outputs of the first current memory circuit, and an output coupled to the digital output and to the input of a DAC capable of producing a differential output current in response to its digital input, and current summing means having a first differential input coupled to the output of the second current memory circuit, a second differential input coupled to the output of the DAC, and a differential output coupled to the differential current output: wherein the first current memory, the comparator, and the DAC are common to the respective conversion stages of the first and second pluralities of conversion stages.

16. An ADC as claimed in claim 15 in which each sample period is divided into four phases: wherein in the conversion stage of the first plurality of conversion stages during a first phase the first current memory circuit samples and stores the input current sample, the output of the second current memory circuit is coupled to the summing means, and the output of the DAC is coupled to the summing means; during a second phase the second current memory circuit samples and stores the input current sample and the output of the first current memory circuit is fed to the comparator; during a third phase the output of the comparator is coupled to the digital output of the conversion stage; and during a fourth phase the result of the comparison is applied to the DAC as its digital input, the output of the Dac is fed to the summing means, and the output of the second current memory circuit is fed to the summing means: and wherein in the conversion stage of the second plurality of conversion stages during the first phase the output of the comparator is coupled to the digital output, during the second phase the result of the comparison is applied to the DAC as its digital input signal, the output of the DAC is fed to the summing means, and the output of the second current memory circuit is fed to the current summing means; during the third phase the first current memory circuit samples and stores the input current sample, the output of the DAC is fed to the current summing means, and the output of the second current memory circuit is fed to the current summing means; and during the fourth phase the second current memory circuit samples and stores the input current sample and the output of the first current memory is coupled to the comparator input.

17. An ADC as claimed in claim 16 in which the output of the comparator is clocked into a first latch circuit at the beginning of the first and third phases, the output of the latch being connected to a common digital output of the respective conversion stages of the first and second pluralities.

18. An ADC as claimed in claim 17 in which the output of the first latch circuit is clocked into a second latch circuit at the beginning of the second and fourth phases, the output of the second latch circuit providing the digital input for the DAC.

* * * * *